United States Patent
Toriumi et al.

(10) Patent No.: US 10,748,776 B2
(45) Date of Patent: Aug. 18, 2020

(54) SEMICONDUCTOR DEVICE INCLUDING CONTACT STRUCTURE

(71) Applicant: JAPAN SCIENCE AND TECHNOLOGY AGENCY, Kawaguchi-shi, Saitama (JP)

(72) Inventors: Akira Toriumi, Tokyo (JP); Tomonori Nishimura, Tokyo (JP)

(73) Assignee: JAPAN SCIENCE AND TECHNOLOGY AGENCY, Kawaguchi-shi, Saitama (JP)

( * ) Notice: Subject to any disclaimer, the term of this patent is extended or adjusted under 35 U.S.C. 154(b) by 0 days.

(21) Appl. No.: 16/326,521

(22) PCT Filed: Feb. 23, 2017

(86) PCT No.: PCT/JP2017/006776
§ 371 (c)(1),
(2) Date: Feb. 19, 2019

(87) PCT Pub. No.: WO2018/042707
PCT Pub. Date: Mar. 8, 2018

(65) Prior Publication Data
US 2019/0228978 A1 Jul. 25, 2019

(30) Foreign Application Priority Data
Sep. 1, 2016 (JP) ................................ 2016-170939

(51) Int. Cl.
*H01L 21/285* (2006.01)
*H01L 29/78* (2006.01)
(Continued)

(52) U.S. Cl.
CPC ........ *H01L 21/28537* (2013.01); *H01L 21/28* (2013.01); *H01L 29/16* (2013.01);
(Continued)

(58) Field of Classification Search
CPC combination set(s) only.
See application file for complete search history.

(56) References Cited

U.S. PATENT DOCUMENTS 6,072,203 A * 6/2000 Nozaki ............. H01L 29/42316
257/194
7,276,312 B2 * 10/2007 Baba ........................ G01J 1/42
136/261
(Continued)

FOREIGN PATENT DOCUMENTS

| JP | 2009059996 A | 3/2009 |
|---|---|---|
| JP | 2012124483 A | 6/2012 |
| JP | 2014041987 A | 3/2014 |
| WO | 2013133060 A1 | 9/2013 |

OTHER PUBLICATIONS

International Search Report dated Apr. 11, 2017, issued in counterpart application No. PCT/JP2017/006776, w/English translation (5 pages).

(Continued)

*Primary Examiner* — Nduka E Ojeh
(74) *Attorney, Agent, or Firm* — Westerman, Hattori, Daniels & Adrian, LLP

(57) ABSTRACT

In the present invention, a contact layer formed of a material having an electron concentration of less than $1 \times 10^{22}$ cm$^{-3}$ is directly provided on a surface of a semiconductor crystal having an n-type conductivity with a band gap of 1.2 eV or less at room temperature. Consequently, the wave function penetration from the contact layer side to the semiconductor surface side is reduced. As a result, the formation of the energy barrier height $\phi_B$ due to the Fermi level pinning phenomenon is much suppressed. It is possible to achieve the contact with a lower resistivity and with high ohmic properties.

6 Claims, 4 Drawing Sheets

(51) Int. Cl.
    *H01L 29/45*    (2006.01)
    *H01L 21/28*    (2006.01)
    *H01L 29/16*    (2006.01)
    *H01L 29/417*   (2006.01)
    *H01L 29/872*   (2006.01)

(52) U.S. Cl.
    CPC ........ *H01L 29/41725* (2013.01); *H01L 29/45* (2013.01); *H01L 29/456* (2013.01); *H01L 29/78* (2013.01); *H01L 29/872* (2013.01)

(56) References Cited

U.S. PATENT DOCUMENTS

| | | | |
|---|---|---|---|
| 2009/0050972 A1* | 2/2009 | Lindsay | H01L 21/823807 257/368 |
| 2010/0176478 A1 | 7/2010 | Toriumi et al. | |
| 2012/0138928 A1 | 6/2012 | Martens et al. | |
| 2015/0091067 A1* | 4/2015 | Pillarisetty | H01L 27/2436 257/288 |

OTHER PUBLICATIONS

Heine, "Theory of Surface States", Physical Review, Jun. 14, 1965, vol. 138, No. 6A, pp. A1689-A1696, (8 pages).

Sze, "Physics of Semiconductor Devices Second Edition", 1981, John Wiley & Sons, New York, pp. 254-259, (5 pages).

Michaelson, "The work function of the elements and its periodicity", Journal of Applied Physics, Nov. 1977, vol. 48, No. 11, pp. 4729-4733, (6 pages).

Wu et al., "Ohmic Contact to n-Type Ge With Compositional W Nitride", IEEE Electron Device Letters, Dec. 2014, vol. 35, No. 12, pp. 1188-1190, cited in ISR (3 pages).

Teng et al., "Fermi Level Depinning on n-Epitaxial GeSn by Yb Stanogermanide Formation With Low-Contact Resistivity", IEEE Electron Device Letters, Sep. 2016, vol. 37, No. 9, pp. 1207-1210, cited in ISR (4 pages).

Kakushima et al., "A Low Temperature Ohmic Contact Process for n-type Ge Substrates", Ext. Abs. the 13h International Workshop on Junction Technology 2013, Jun. 6, 2013, pp. 35-36, cited in ISR (2 pages).

* cited by examiner (A)   (B)

SEMICONDUCTOR DEVICE INCLUDING CONTACT STRUCTURE

TECHNICAL FIELD

The present invention relates to a contact structure of contact with high ohmic properties (having a low Schottky barrier height $\phi_B$) provided on a surface of a semiconductor crystal having an n-type conductivity.

BACKGROUND ART

Electrodes are essential for semiconductor devices. It is necessary to realize ohmic contact between an electrode and a semiconductor surface and reduce contact resistance as small as possible. For this purpose, the following two kinds of methods are usually adopted. A first method is a method of increasing impurity concentration on a semiconductor side and constructing a situation in which electrons in metal move in and out the semiconductor side through a tunnel effect. A second method is a method of selecting, as a material of the electrode, a material having a work function that can make ohmic contact with a semiconductor material surface.

However, when a conductivity type of a semiconductor crystal is an n type, it is known that, even if a metal having a work function that theoretically should make ohmic contact is selected, in many cases, the metal comes into make Schottky-contact. This phenomenon is considered to be due to so-called "Fermi level pinning".

According to the Schottky theory, a Schottky barrier height $\phi_B$ generated on a contact surface (a junction surface) between an n-type semiconductor and metal is given by a difference ($\phi_M-\phi_X$) between a work function $\phi_M$ of the metal and electron affinity $\phi_X$ of the n-type semiconductor. However, in most cases, an energy barrier by the Schottky theory is not equal in height to an actual Schottky barrier. Such a phenomenon is called the Fermi level pinning because the phenomenon looks like an effect caused by "pinning" the Fermi level. This Fermi level pinning is a phenomenon seen at the junction with not only Si but also most semiconductors such as Ge and a metal. The unit of $\phi_M$, $\phi_X$, and $\phi_B$ is [V], respectively.

Contact resistivity $\rho_C$ on a junction interface between an n-type semiconductor and an electrode material is in a relation of the following Expression 1 with the Schottky barrier height $\phi_B$ and donor concentration $N_D$ per unit volume of the junction interface region. Note that $\pi$ in the expression is a constant.

$$\rho_C \propto \exp\left(\lambda \frac{\phi_B}{\sqrt{N_D}}\right) \quad \text{(Expression 1)}$$

That is, in order to form an ohmic junction interface between the n-type semiconductor and the electrode material and in order to reduce the contact resistivity $\rho_C$, either the Schottky barrier height $\phi_B$ has to be reduced or the donor concentration $N_D$ of the junction interface region has to be increased.

However, increasing the donor concentration $N_D$ of the junction interface region is limited by the solid solubility limit of donor in semiconductor in the thermal equilibrium. Usually, the donor concentration is increased to near the solid solubility limit and cannot be increased to the concentration higher than that. On the other hand, as explained above, particularly in the case of an n-type semiconductor, the Schottky barrier height $\phi_B$ cannot be sufficiently reduced to a desired level because of the Fermi level pinning phenomenon.

Furthermore, the area of the contact decreases, as the semiconductor device is miniaturized. As it is easily understood from the above Expression 1, when the contact area is represented as S, actual contact resistance Rc is $\rho_C$/S. Even when same $\rho_C$ is used, the actual contact resistance Rc increases sharply with miniaturization and effectively prevents the inherent performance improvement of the semiconductor device. That is, it is strongly demanded to reduce $\rho_C$ itself in order not to increase the ratio of the contact resistance to the total resistance between the drain electrode and the source electrode with the miniaturized semiconductor device.

Therefore, as explained above, it has also been attempted to achieve the ohmic contact by providing the semiconductor layer having the high donor concentration $N_D$ in the junction interface region between the n-type semiconductor and the electrode material (see Patent Literature 1: Japanese Patent Application Laid-Open No. 2012-124483 and Patent Literature 2: Japanese Patent Application Laid-Open No. 2014-41987).

For example, Patent Literature 2 states that it is known that a barrier height $\phi_B$ is generated against electrons flowing in a direction from metal to n-type Ge by the Fermi level pinning phenomenon between the n-type Ge and the metal electrode and, as a result, the contact resistance is increased, and it is assumed that, if an n-type Ge layer with an increased electron concentration (carrier concentration) is inserted between the n-type Ge and the metal electrode, a depletion layer is extremely narrowed, electrons can tunnel, and cause ohmic contact. Patent Literature 2 discloses an invention of an ohmic contact structure characterized in that an n$^+$-type Ge layer having an electron concentration of $10^{19}$ cm$^{-3}$ or more and a thickness of 2 nm or more is formed between the metal layer for electrode and the n-type Ge layer for the purpose of providing an n$^+$-type Ge semiconductor layer forming method and an ohmic contact structure for reducing contact resistance between the electrode layer and the n-type Ge layer through an inexpensive process.

CITATION LIST

Patent Literature

Patent Literature 1: Japanese Patent Application Laid-Open No. 2012-124483
Patent Literature 2: Japanese Patent Application Laid-Open No. 2014-41987

Non Patent Literature

Non Patent Literature 1: V. Heine, "Theory of Surface States," Phys. Rev. 138, A1689 (1965)
Non Patent Literature 2: S. M. Sze, Physics of Semiconductor Devices, 2nd ed. Wiley, New York (1981)
Non Patent Literature 3: H. B. Michaelson, J. Appl. Phys. 48, 4729 (1977).

SUMMARY OF INVENTION

Technical Problem

However, as in the methods disclosed in Patent Literature 1 and Patent Literature 2, when the semiconductor layer having the high donor concentration $N_D$ is provided in the junction interface region between the n-type semiconductor and the electrode material, a process for forming the semiconductor layer having the high donor concentration is required. As a result, an increase in manufacturing cost of a semiconductor device is caused. Furthermore, new defects are often introduced by introducing donors equal to or more than the solid solubility limit achieved in the thermal equilibrium state. There is a concern that a reverse bias leak current of n+/p junction remarkably increases.

Accordingly, rather than deliberately providing a new semiconductor layer in the junction interface region on the n-type semiconductor side, it is desirable to achieve contact with high ohmic properties by selecting the electrode material bonded to the surface of the n-type semiconductor. It is expected that the contact resistivity can be greatly reduced according to the above Expression 1 by realizing the electrode with small $\phi_B$ in addition to the disposition of the high-concentration donor layer near the junction interface on the n-type semiconductor side.

Solution to Problem

In order to solve the problems described above, a semiconductor device according to the present invention is characterized by including a contact structure in which a contact layer formed of a material having an electron concentration of less than $1\times10^{22}$ cm$^{-3}$ is directly provided on a surface of a semiconductor crystal having an n-type conductivity with a band gap of 1.2 eV or less at room temperature.

Preferably, the semiconductor crystal is any one of Si, Ge, and a compound of Si and Ge ($Si_xGe_y$).

In a certain form, the semiconductor crystal is Ge, and the contact layer is formed of a material containing, as a main component, a germanide of any one of Gd, Y, Ho, Er, and Yb, or Bi.

In a certain form, the semiconductor crystal is Si, and the contact layer is formed of a material containing Bi as a main component.

As the contact layer, it is also possible to select a material that can make contact with high ohmic properties when a donor concentration of a surface region of the semiconductor crystal is $1\times10^{18}$ cm$^{-3}$ or less. In the conventional structure, when the donor concentration is low concentration such as $1\times10^{18}$ cm$^{-3}$ or less, it is difficult to obtain the ohmic contact. On the other hand, in the structure of the present invention, it is possible to obtain the ohmic contact even in the case of the low donor concentration.

The contact structure included in the semiconductor device according to the present invention can be a form including a metal layer on the contact layer.

The semiconductor device according to the present invention is an n-channel MOSFET in which the semiconductor crystal is Si or Ge.

Advantageous Effects of Invention

According to the present invention, the contact layer formed of the material having the electron concentration of less than $1\times10^{22}$ cm$^{-3}$ is directly provided on the surface of the semiconductor crystal having the n-type conductivity with the band gap of 1.2 eV or less at room temperature. Therefore, the penetration of the electron wave function from the contact layer side to the semiconductor surface side is suppressed. As a result, generation of the barrier height $\phi_B$ due to the Fermi level pinning phenomenon is suppressed. As a result, it becomes possible to achieve contact with high ohmic properties.

DESCRIPTION OF EMBODIMENTS

Figure 1:
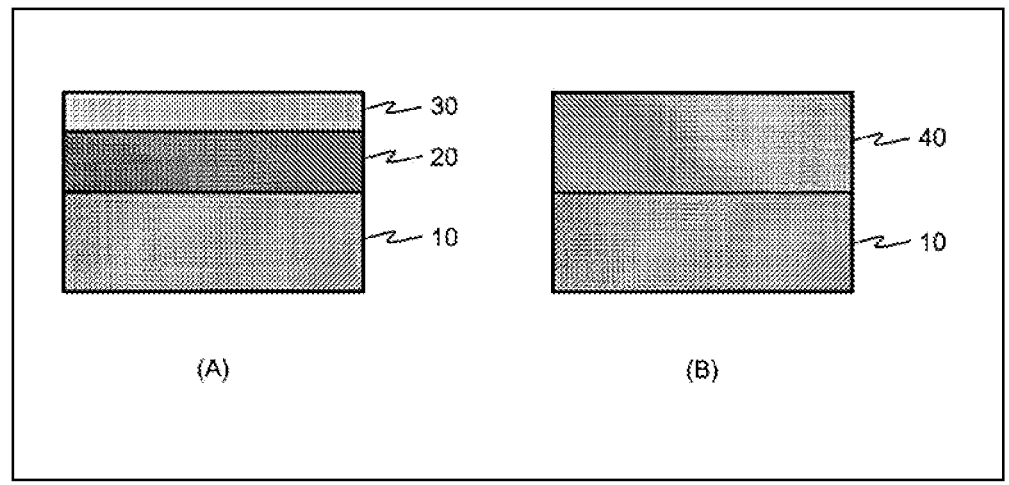
FIG. 1 is a diagram for conceptually explaining a stacked state (A) after film formation and a stacked state (B) after heat treatment.

A contact structure according to the present invention is explained below with reference to the drawings.

As explained above, in manufacturing a semiconductor device using typical semiconductor crystal such as Si or Ge, when a contact structure of contact with high ohmic properties is intended, even if a work function of a metal material used as an electrode is changed, it is difficult to achieve desired ohmic properties because of the Fermi level pinning phenomenon. This difficulty is conspicuous, in particular, in an n-type conductivity semiconductor crystal.

Note that, when the band gap of the semiconductor is large, such a phenomenon is not so conspicuous. Accordingly, in realizing contact with high ohmic properties in the n-type semiconductor crystal having an energy band gap of approximately 1.2 eV or less at room temperature, it is a real problem how to suppress the Fermi level pinning phenomenon.

In solving this problem, the inventors devised the present invention considering that the influence of Fermi level pinning can be conspicuously reduced by preventing penetration of electrons (a wave function) from the contact layer side to the semiconductor crystal side.

There are many arguments over the origin of the Fermi level pinning. However, in all the cases, it is considered that an interface dipole layer is formed and the effect of the interface dipole layer is determined by dipole density and strength of dipoles. Thereafter, in order to explain the Fermi level pinning phenomenon on the basis of the discussion over the level of the semiconductor interface of V. Heine, Metal Induced Gap States theory (MIGS model) has been proposed (Non Patent Literature 1: "Theory of Surface States," Phys. Rev. 138, A1689 (1965)).

In this MIGS theory, the consistency of the wave function (consistency of the Fermi surface) at the junction interface between the metal and the semiconductor having different band structures is regarded as a problem. Nonconsistency of a band gap energy occurs on the junction interface between the metal and the semiconductor. Therefore, the wave function of the metal is attenuated in the energy band gap in the semiconductor. Specifically, the wave function (a sine wave) is exponentially attenuated in the potential barrier present at the junction interface. In other words, the wave function of the metal penetrates into the energy band gap of the semiconductor. The Fermi level pinning phenomenon becomes more conspicuous as the degree of the wave function penetration increases.

The inventors have found that, based on the MIGS theory, if the degree of the wave function penetration is reduced to conspicuously low, the Fermi level pinning phenomenon is conspicuously suppressed and it is possible to easily obtain contact with high ohmic properties.

The inventors reached the knowledge that, to reduce the degree of the wave function penetration to be conspicuously low, it is effective to design the electron concentration in the material used as the contact layer to be low.

According to the calculation of the inventors based on a simple free electron model, when the energy band offset between the contact layer and the semiconductor is a predetermined value, the wave function penetration amount ($\Delta n_{transfer}$) from the contact layer side to the semiconductor crystal side is proportional to ⅓ to ⅔ power of the free electron concentration (n) in the material used as the contact layer ($\Delta n_{transfer} \propto n^{1/3 \; to \; 2/3}$) Since the electron concentration in a general metal material is $10^{22}$ to $10^{23}$ cm$^{-3}$, it is possible to conspicuously reduce the wave function penetration amount from the contact layer side to the semiconductor crystal side by designing the electron concentration in the material used as the contact layer to be low. Therefore, as the material satisfying such conditions, the inventors focused on, rather than the conventional metal, the material having electric conductivity such as the compound of the semiconductor and the metal (germanide in the case of Ge or silicide in the case of Si) or semimetals or conductive oxides.

According to the examination of the inventors, a result was obtained that a contact structure showing a contact characteristic with high ohmic properties is obtained if a conductive material having an electron concentration of less than $1 \times 10^{22}$ cm$^{-3}$ is selected as a material of a contact layer directly provided on the surface of a semiconductor crystal having an n-type conductivity with a band gap of 1.2 eV or less at room temperature.

In this specification, at a junction region of different kinds of materials, a contact in which an electric current linearly changes in a range of ±10% when a voltage is changed in a range of −0.5 V to +0.5 V is defined as "a contact with high ohmic properties".

As the semiconductor crystal having the energy band gap of 1.2 eV or less at room temperature, Si, Ge, and a compound of Si and Ge ($Si_xGe_y$) can be illustrated.

As the combination of the semiconductor and the contact layer material, a conducive material in which the semiconductor crystal is Ge and the contact layer is a conductive material which contains, as a main component, a germanide of any one of Gd, Y, Ho, Er, and Yb, or a conductive material which contains, as a main component Bi can be illustrated.

A combination in which the semiconductor crystal is Si and the contact layer is a material containing Bi as a main component can also be illustrated.

Note that, when the donor concentration in the surface region of the semiconductor crystal is high and the electron concentration at the junction interface with the contact layer is sufficiently high, ohmic contact properties can be obtained in the first place. However, in the conventional structure, it is difficult to obtain ohmic contact when the donor concentration is low concentration such as $1 \times 10^{18}$ cm$^3$ or less. On the other hand, in the structure of the present invention, contact with high ohmic properties can be obtained even when the donor concentration is low concentration such as $1 \times 10^{18}$ cm$^{-3}$ or less. Therefore, design or selection of such a contact layer is an extremely important technique. In particular, this effect can be obtained even when realization of a high-concentration layer is difficult. This greatly expands an application range to devices.

It goes without saying that such a contact structure may be a form including a metal layer on the contact layer.

The semiconductor device including such a contact structure may be, for example, an n-channel MOSFET in a C-MOS in which the semiconductor crystal is Si or Ge.

EXAMPLE

[Relaxation of FLP at a metal germanide/n-Ge junction interface]

As explained above, there are many arguments over the origin of the Fermi level pinning (FLP). However, in all the cases, it is considered that an interface dipole layer is formed and the size of the interface dipole layer is determined by dipole density and strength of dipoles.

In this example, a metal having low electron concentration was formed by forming a compound of metal and Ge, the strength and the density of dipoles were changed by changing the penetration amount of wave function in the metal, and FLP that occurred at the junction interface with n-Ge was systematically examined.

A film of various kinds of metal (Gd, Ho, Er, Yb, Ti, Co, and Pt) having a thickness of 30 nm was vapor-deposited and formed on an n-type (100) Ge substrate having donor concentration of $10^{16}$/cm$^3$ level. A film of amorphous Ge with a thickness of 20 nm was vapor-deposited and formed on the film. Thereafter, heat treatment for 30 minutes was performed at 500° C. in vacuum (approximately $10^{-5}$ Pa) to form metal-Ge compound/n-Ge junction. It was confirmed by an X-ray diffraction method that polycrystalline germanide was formed in all of these samples by the heat treatment. Note that, for comparison, samples obtained by performing only the film formation of the kinds of metal and not performing the heat treatment were also manufactured. Schottky characteristics of the junction interfaces were evaluated for these samples.

FIG. 1 is a diagram for conceptually explaining a stacked state (FIG. 1(A)) after the film formation and a stacked state (FIG. 1(B)) after the heat treatment. A metal film 20 and a film 30 of amorphous Ge were stacked on the surface of an n-type (100) Ge substrate 10 after the film formation. After the heat treatment for 30 minutes at 500° C., the metal film 20 and the film 30 of amorphous Ge become the metal germanide film 40 and the metal germanide film 40 was directly bonded on the surface of the Ge substrate 10.

Figure 2:
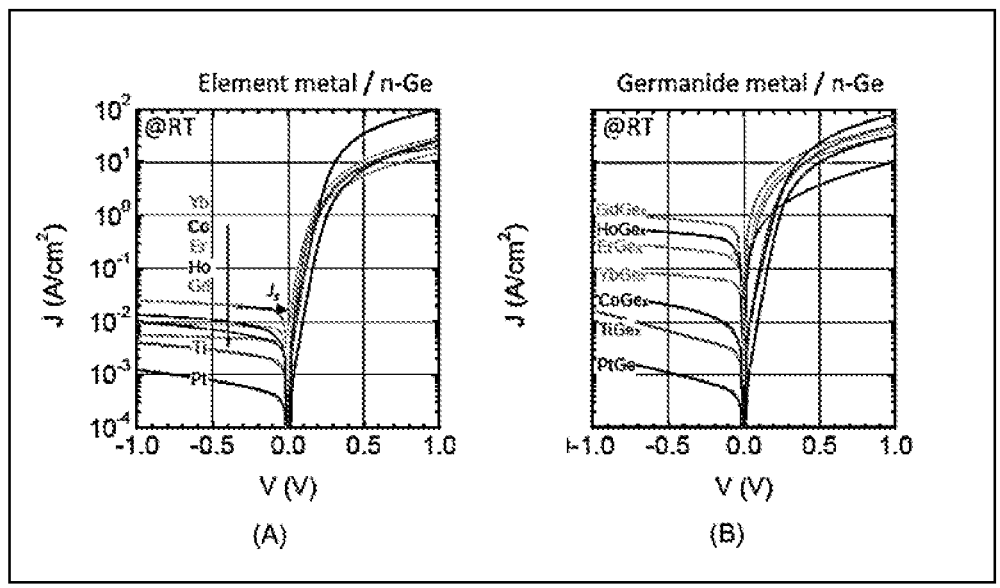
FIG. 2 is a diagram showing a J-V characteristic (A) of elemental metal/n-Ge junction and a J-V characteristic (B) of metal germanide/n-Ge junction.

FIG. 2 is a diagram showing J-V characteristics (FIG. 2(A)) at room temperature of elemental metal/n-Ge junction and a J-V characteristic (FIG. 2(B)) of metal germanide/n-Ge junction at room temperature. First, from comparison of FIG. 2(A) and FIG. 2(B), it is clearly seen that ohmic properties are improved by forming the metal germanide/n-Ge junction.

When seven kinds of metal germanide/n-Ge junctions shown in FIG. 2(B) are compared, increases in an OFF current and saturation current density ($J_s$: an extrapolation value of J at V=0) are recognized at the junctions with n-Ge of the metal germanides formed by kinds of metal (Gd, Ho, Er, and Yb) having relatively low work function. Note that, the same effect was obtained in materials containing germanide of Y and in materials containing Bi as main components, other than the Gd, Ho, Er, and Yb.

Figure 3:
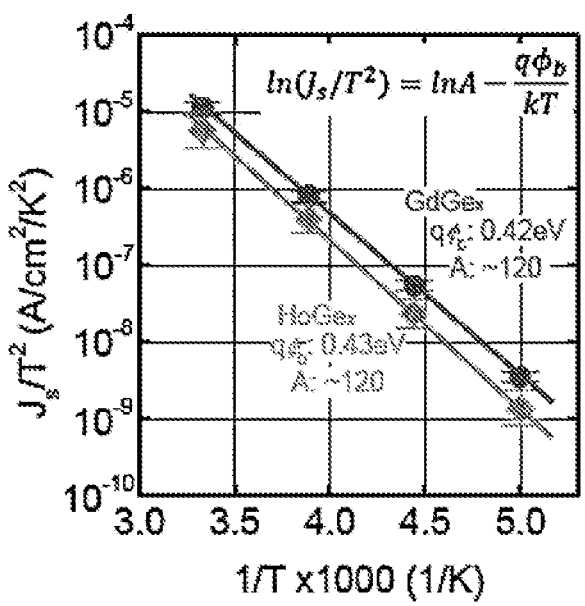
FIG. 3 is a diagram showing a result obtained by checking, concerning Gd germanide/n-Ge junction and Ho germanide/n-Ge junction, a Schottky barrier height ($\phi_b$) and uniformity thereof from temperature dependence of saturation current density $J_s$.

FIG. 3 is a diagram showing examined results of, Schottky barrier heights ($\phi_b$) and uniformity thereof obtained from temperature dependence of saturation current density $J_s$, for Gd germanide/n-Ge (GdGex/n-Ge) junction and Ho germanide/n-Ge (HoGex/n-Ge) junction.

From gradients of straight lines indicating the temperature dependence shown in this figure, the Schottky barrier height ($\phi_b$) is estimated as 0.42 eV for the Gd germanide/n-Ge junction and estimated as 0.43 eV for the Ho germanide/n-Ge junction. A Richardson constant estimated from intercepts of the straight lines substantially coincides with a value 143A/cm$^2$/K$^2$ described in Non Patent Literature 2. This fact indicates that a Schottky barrier is uniformly formed rather than a leak due to a local barrier lowering.

From these results, it is considered that the density of formed dipoles decreases at the metal germanide/n-Ge junction interface and, as a result, relaxation of FLP occurs.

[Surface Orientation Dependence of FLP Relaxation in n-Ge]

Figure 4:
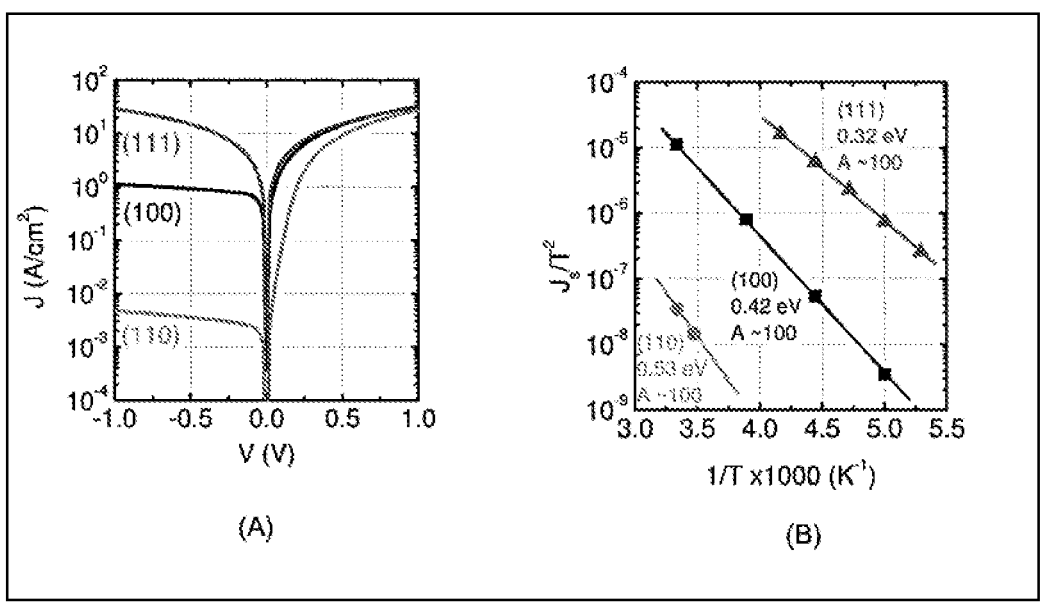
FIG. 4 is a diagram showing a result obtained by checking n-Ge crystal surface orientation dependence of a degree of FLP relaxation.

FIG. 4 is a diagram showing examined results on n-Ge crystal surface orientation dependence of a degree of the FLP relaxation. As a sample, Gd germanide was provided on an n-Ge substrate having (111), (100), and (110) as principal planes and Gd germanide/n-Ge junction was formed.

From. J-V characteristics at room temperature shown in FIG. 4(A), the FLP relaxation is particularly conspicuous on the (111) surface. From gradients of straight lines indicating temperature dependence shown in FIG. 4(B). the Schottky harrier height ($\phi_b$) in this example is estimated as 0.32 eV for Gd germanide/(111)n-Ge junction, estimated as 0.42 eV for Gd germanide/(100)n-Ge junction, and estimated as 0.53 eV for Gd germanide/(110)n-Ge junction. It is read that a Schottky barrier is uniformly formed.

Figure 5:
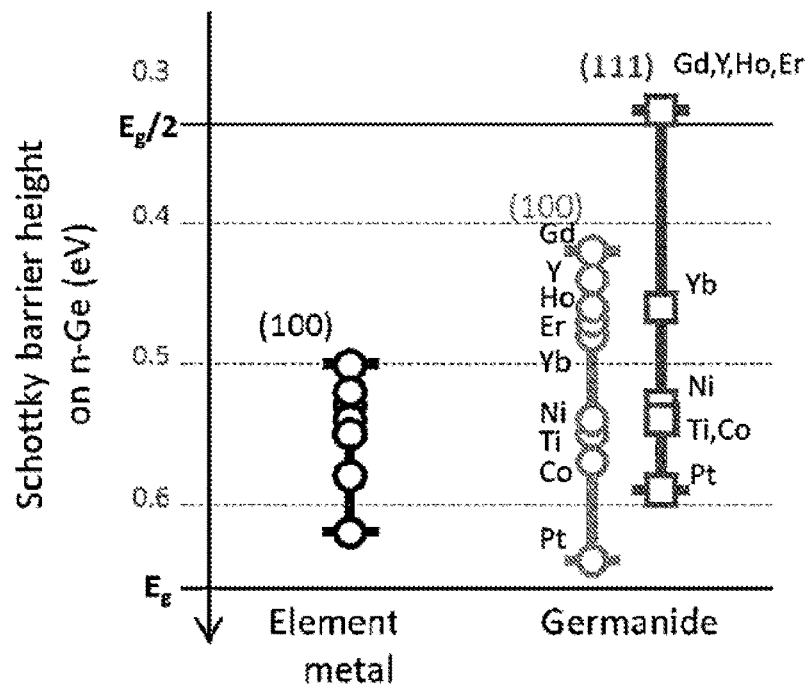
FIG. 5 is a measurement value of the Schottky barrier height for each material used as a contact layer.

In FIG. 5, dependence of Schottky barrier heights on materials of contact layers provided on an n-Ge substrate is summarized. On the left side in the figure, Schottky barrier heights in the case in which a contact layer of a pure single elemental metal material is provided on an n-type Ge(100) surface are shown. On the right side of the figure, Schottky barrier heights in the case in which a contact layer formed of germanide (a metal-Ge compound) of the single elemental element is provided on the n-type Ge(100) surface and an n-type Ge(111) surface are shown. As explained above, a tendency that the Schottky barrier height is low is clearly read when a contact layer formed of a germanide material is provided compared with when a contact layer formed of a metal material is provided. The Schottky barrier height tends to be low when the principal plane of the n-Ge substrate is (111) compared with when the principal plane is (100).

[Relaxation of FLP on a Bi-based material/n-Si junction interface]

Figure 6:
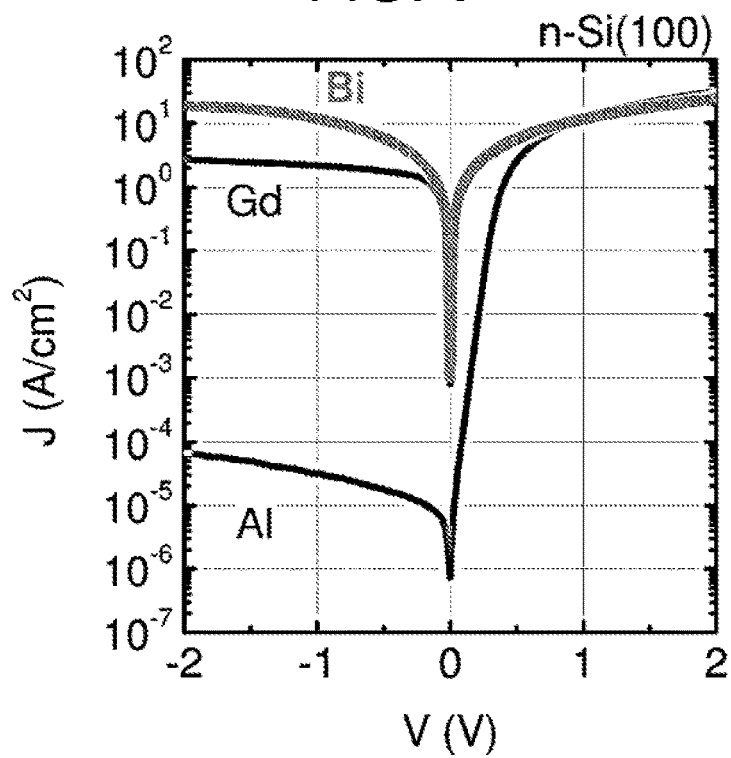
FIG. 6 is a diagram showing a result obtained by checking relaxation of FLP on a Bi-based material/n-Si junction interface.

FIG. 6 is a diagram showing an examined result of relaxation of FLP on a Bi-based material/n-Si junction interface in the case in which the semiconductor crystal is n-Si instead of n-Ge. A surface orientation of n-Si shown in this figure is (100). Bi was provided on this Si substrate as a contact layer to form Bi/n-Si junction. Note that, for comparison, samples were manufactured for Gd/n-Si junction and Al/n-Si junction.

From J-V characteristics at room temperature shown in FIG. 6, relaxation of FLP at a junction interface becomes stronger in the order of an Al contact layer, a Gd contact layer, and a Bi contact layer. In particular, substantially complete ohmic properties are obtained in the case of the Bi contact layer (Bi/n-Si junction).

Free electron concentration in these kinds of metal is $2 \times 10^{23}$ cm$^{-3}$ in Al, $6 \times 10^{23}$ cm$^{-3}$ in Gd, and $10^{16}$ to $10^{17}$ cm$^{-3}$ in Bi. On the other hand, concerning the work function, a value of about 4.3 V is reported in Al, a value of 3.1 V is reported in Gd, and a value of 4.2 V is reported in Bi (see Non Patent Literature 3). It is clearly read that Bi and Al have substantially the same work function but a degree of FLP at the junction interface is extremely weak in Bi having low free electron density and, concerning the Schottky barrier height, Bi is substantially close to Gd or other materials having a work function lower than the work function of Gd.

[Thinning of a Contact Layer]

Figure 7:
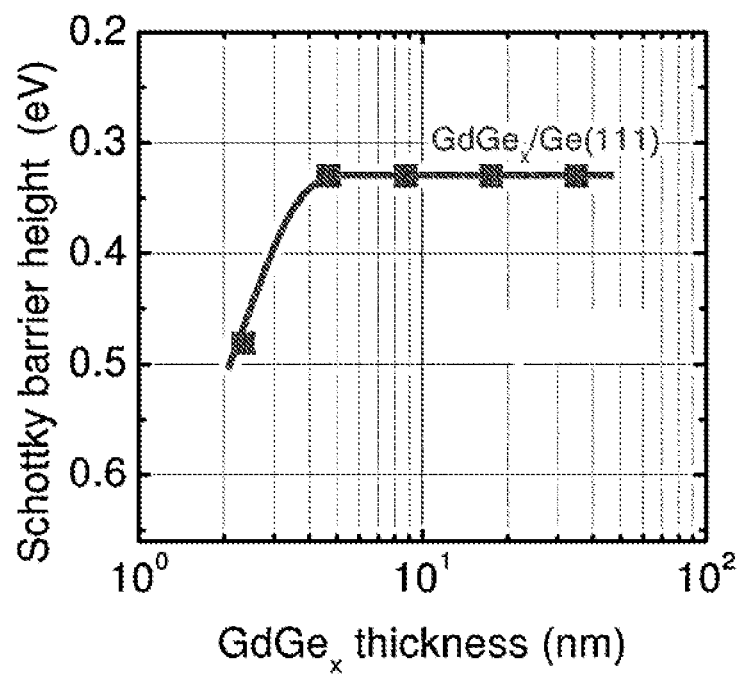
FIG. 7 is a diagram showing a result obtained by checking Gd germanide (GdGe$_x$), which functions as a contact layer, thickness dependence of Schottky barrier height in Gd germanide/n-Ge junction.

FIG. 7 is a diagram showing a examined result of dependence of a Schottky barrier height (barrier height) at Gd germanide/n-Ge junction on the thickness of Gd germanide (GdGe$_X$), which functions as a contact layer. Note that, in an example shown in this figure, a substrate is Ge, a principal plane of which is a (111) surface. The Schottky barrier height indicates a substantially fixed low value when the thickness of the contact layer exceeds approximately 4 nm. Satisfactory ohmic contact is obtained.

As explained above, according to the present invention, the contact layer formed of the material having the electron concentration of less than $1 \times 10^{22}$ cm$^{-3}$ is directly provided on the surface of the semiconductor crystal having the n-type conductivity with the energy band gap of 1.2 eV or less at room temperature. Therefore, the wave function penetration from the contact layer side to the semiconductor surface side is reduced. As a result, the formation of energy barrier height $\phi_B$ due to the Fermi level pinning phenomenon is reduced. It is possible to achieve contacts with high ohmic properties.

Note that, in carrying out the present invention, it goes without saying that the contact structure can be a form including a metal layer on the contact layer.

The contact structure according to the present invention is extremely useful in semiconductor devices such as C-MOS.

INDUSTRIAL APPLICABILITY

According to the present invention, the wave function penetration from the contact layer side to the semiconductor surface side is significantly suppressed. As a result, the formation of the energy barrier height $\phi_B$ due to the Fermi level pinning phenomenon is reduced. It is possible to achieve contacts with high ohmic properties.

REFERENCE SIGNS LIST 10 n-type Ge substrate
20 metal film
30 film of amorphous Ge
40 metal germanide film

The invention claimed is:

1. A semiconductor device comprising a contact structure in which a contact layer formed of a material having an electron concentration of less than $1 \times 10^{22}$ cm$^{-3}$ is directly provided on a surface of a semiconductor crystal having an n-type conductivity with a band gap of 1.2 eV or less at room temperature,
    wherein a donor concentration of a surface region of the semiconductor crystal is $1 \times 10^{18}$ cm$^{-3}$ or less.

2. The semiconductor device according to claim 1, wherein the semiconductor crystal is any one of Si, Ge, and a compound of Si and Ge ($Si_xGe_y$).

3. The semiconductor device according to claim 1, wherein the semiconductor crystal is Ge, and the contact layer is formed of a material containing, as a main component, a germanide of any one of Gd, Y, Ho, Er, and Yb, or Bi.

4. The semiconductor device according to claim 1, wherein the semiconductor crystal is Si, and the contact layer is formed of a material containing Bi as a main component.

5. The semiconductor device according to claim 1, wherein the semiconductor device includes a metal layer on the contact layer.

6. The semiconductor device according to claim 1, wherein the semiconductor device is an n-channel MOSFET in which the semiconductor crystal is Si or Ge.

\* \* \* \* \*